United States Patent
Yamabe et al.

(10) Patent No.: US 8,355,908 B2
(45) Date of Patent: Jan. 15, 2013

(54) AUDIO SIGNAL PROCESSING DEVICE FOR NOISE REDUCTION AND AUDIO ENHANCEMENT, AND METHOD FOR THE SAME

(75) Inventors: Takaaki Yamabe, Yokohama (JP); Masaya Konishi, Yokohama (JP)

(73) Assignee: JVC Kenwood Corporation, Yokohama-shi, Kanagawa (JP)

( * ) Notice: Subject to any disclaimer, the term of this patent is extended or adjusted under 35 U.S.C. 154(b) by 499 days.

(21) Appl. No.: 12/452,795

(22) PCT Filed: Mar. 19, 2009

(86) PCT No.: PCT/JP2009/055513
§ 371 (c)(1),
(2), (4) Date: Jan. 22, 2010

(87) PCT Pub. No.: WO2009/119460
PCT Pub. Date: Oct. 1, 2009

(65) Prior Publication Data
US 2010/0128882 A1 May 27, 2010

(30) Foreign Application Priority Data

Mar. 24, 2008 (JP) .................................. 2008-076605
Dec. 26, 2008 (JP) .................................. 2008-334908

(51) Int. Cl.
*G10L 19/14* (2006.01)

(52) U.S. Cl. ...................................................... 704/224
(58) Field of Classification Search ........... 704/224–228
See application file for complete search history.

(56) References Cited

U.S. PATENT DOCUMENTS

| 4,811,404 | A | * | 3/1989 | Vilmur et al. ................ 381/94.3 |
| 5,133,013 | A | | 7/1992 | Munday |
| 5,687,285 | A | | 11/1997 | Katayanagi et al. |
| 6,415,253 | B1 | * | 7/2002 | Johnson ........................ 704/210 |
| 7,376,558 | B2 | * | 5/2008 | Gemello et al. ............... 704/226 |
| 7,464,029 | B2 | * | 12/2008 | Visser et al. .................. 704/210 |
| 8,180,635 | B2 | * | 5/2012 | Cui et al. ...................... 704/233 |
| 2004/0044525 | A1 | * | 3/2004 | Vinton et al. .................. 704/224 |
| 2004/0078199 | A1 | * | 4/2004 | Kremer et al. ................ 704/233 |
| 2007/0021958 | A1 | * | 1/2007 | Visser et al. .................. 704/226 |

FOREIGN PATENT DOCUMENTS

| JP | 3-247011 A | 11/1991 |
| JP | 6-208395 A | 7/1994 |

(Continued)

OTHER PUBLICATIONS

Extended Search Report issued on Jun. 24, 2010, in counterpart European Application No. 09725142.5.

*Primary Examiner* — Michael N Opsasnick
(74) *Attorney, Agent, or Firm* — Nath, Goldberg & Meyer; Jerald L. Meyer (57) ABSTRACT

In frequency signals obtained by converting input audio signals from time-domain signals to frequency-domain signals, a level control value setting unit 5 establishes a level control value for reducing the levels of spectrums at a noise-components level. A level control value smoothing unit 6 carries out a smoothing process of smoothing the level control value established by the level control value setting unit 5 temporally. A spectral adjustment unit 8 multiplies the level control value after the smoothing process by the frequency signals, performing a level control.

6 Claims, 5 Drawing Sheets

FOREIGN PATENT DOCUMENTS

| | | |
|---|---|---|
| JP | 8-221093 A | 8/1996 |
| JP | 2001-134287 A | 5/2001 |
| JP | 2002-527785 | 8/2002 |
| JP | 2002-359899 A | 12/2002 |
| JP | 2005-86462 A | 3/2005 |
| WO | WO 02/05262 A2 | 1/2002 |

\* cited by examiner

AUDIO SIGNAL PROCESSING DEVICE FOR NOISE REDUCTION AND AUDIO ENHANCEMENT, AND METHOD FOR THE SAME

This is a National Phase Application filed under 35 U.S.C. 371 as a national stage of PCT/JP2009/055513, filed on Mar. 19, 2009, which claims foreign priority benefit under 35 USC 119 of Japanese Application No. 2008-076605, filed on Mar. 24, 2008, and which claims foreign priority benefit under 35 USC 119 of Japanese Application No. 2008-334908, filed on Dec. 26, 2008, the entire content of each of which is hereby incorporated herein by reference.

TECHNICAL FIELD

The present invention relates to an audio signal processing device and an audio signal processing method, both of which enable noise components included in audio signals to be reduced.

BACKGROUND OF ART

Hitherto, there are proposed a variety of techniques of reducing noise components included in audio signals in order to make voice and sound easy to be heard. For instance, a method of spectral deduction is known as a technique of analyzing inputted audio signals in real time and further controlling signals in frequency ranges thereby to reduce the noise components.

By deducting the noise spectrum estimated on the basis of spectral signals divided by Fourier transformation from the audio signals containing the noise components, the method of spectral deduction is a method of making it easy to listen to the audio signals after Fourier transformation.

In the method of spectral deduction, the presence or absence of audio signals is determined on the assumption that the noise components are stationary elements, and a noise model is specified. Additionally, it is also possible to adjust the noise spectrum for deduction, corresponding to the intensity of signal component and the kind of signal (vowel, consonant, fricative, etc.).

In the method of spectral deduction, the minimum mean squared error method etc. is used to estimate the noise spectrum. In the minimum mean squared error method, generally, there are executed repeated computations to minimize a square error mean of different signals in a specific observing zone, requiring a sizable amount of computation.

In addition, it is required to extract stationary noise components in the method of spectral deduction. For the application field, it is suitable in the utilization of sound receiving signals of a microphone in a mobile telephone in a situation where nearly-constant circumferential noises are produced, video-conference call system and so on.

As an application of this method, for the purpose of reducing the amount of computation furthermore, there is disclosed a technique of restraining by-productive noise components generated when a signal component changes greatly (quantization noise based on an error generated by the adjustment in the level of spectrum component and the deduction of an estimated error) in Patent Document No. 1.

In Patent Document No. 1, there is disclosed a technique of controlling the reduction amount of the noise components with respect to each conversion zone corresponding to the characteristic of signals and further conducting the above reduction amount rapidly with reference to a table established to reducing the amount of calculations in advance.

Further, in order to restrain an occurrence of quantization noise in response to a transient signal as possible, Patent Document No. 2 discloses a technique of temporally smoothing a control amount of noise components controlled with respect to each conversion zone and a technique of applying weighting on each analytical zone.

In prior art, there is known a voice enhancing technology to enhance a predetermined frequency band in the audio signals in order to enable even the aged have a fading sense of hearing to catch the sound clearly. This technology is utilized in audio reproducing devices, hearing aids and so on.

For instance, in order to prevent high frequency component from being emphasized too much when enhancing the voice and also prevent the sound volume from being increased too much in spite of a high input sound pressure, Patent Document No. 3 discloses a technique of analyzing inputted audio signals and further providing an appropriate gain adjustment based on the analysis result thereby to improve the clearness of sound.

In addition, similarly to Patent Document No. 3, in order to avoid a phenomenon that emphasizing of only a specific frequency band in enhancing the voice causes the balance of original sound to collapse thereby increasing the difficulty in hearing, Patent Document No. 4 discloses a technique of comparing a sound volume set in an audio signal reproducing device with the levels of input signals and further supplying them with a gain corresponding to the input sound pressure thereby to emphasize the audio signals so as to enable vocal or speech to be clearly audible even at a small volume and also emphasize the audio signals appropriately while maintaining the balance of original sound at a middle or high volume.

Patent Document No. 1

Japanese Patent Publication Laid-open (Heisei) No. 8-221093;

Patent Document No. 2

Japanese Patent Application Publication No. 2004-502977;

Patent Document No. 3

Japanese Patent Publication Laid-open No. 2002-359899;

Patent Document No. 4

Japanese Patent Publication Laid-open No. 2005-86462.

DISCLOSURE OF THE INVENTION

However, the above-mentioned techniques disclosed in Patent Document Nos. 1 and 2 are optimized on the premise of utilization of a mobile telephone on the main application of techniques. For this reason, these techniques are insufficient to reduce the noise components of audio sound in such a broadcasting receiver (for example, radio receiver and TV receiver) that the noise components are often added to a source of signals while the receiver is adapted to other uses, particularly, reproducing of broad band audio signals.

In the TV receiver, particularly, it is difficult to specify the noise components because there are combined not only noise components derived from the receiving sensitivity of a broadcasting system but a variety of noise generating sources, such as background noise included in contents themselves and noise components derived from a power source system, a tape feeding system or a disc rotating system in a home VTR connected to a TV receiver. Thus, sufficient noise reduction effect cannot be expected in a method dealing with the possibility of stationary noise components, such as Patent Document Nos. 1 and 2.

In the broadband audio signals different from speech or voice of narrow band, it is required to pay attention to the presence of quantization noise accompanied with man-made alteration of a spectrum level particularly. Thus, it is acoustically unfavorable to adopt a noise-components reduction model for speech or voice as it is.

In addition, as calculations of log, pow, square root, etc. are frequently executed in the minimum mean squared error method or in the calculation of dB value, the computing quantity gets increased. Consequently, the circuit size in the noise reduction device is increased and therefore, high-priced chips have to be adopted as integrated circuits, requiring the further refinement of manufacturing cost.

In a voice enhancer using a filter on a temporal axis as shown in Patent Document Nos. 3 and 4 mentioned above, when required to reduce noise in an enhanced frequency band, it is necessary to arrange a noise reduction circuit in front or back of an enhance circuit, causing its circuit size to be increased. Further, it often happens that the sound level of a frequency band to be emphasized, such as speech and vocal, is reduced by the noise reduction circuit consequently, so that the effect of voice enhancement is weakened.

In the first place, the voice band enhancing device like a voice enhancer has an effect of amplifying a specific frequency band of input audio signals, while there is the possibility that the sound quality is deteriorated by also amplifying noise components in the same frequency band causes. Particularly, in case of audio signals having a small S/N ratio, the adverse effect by the voice enhancer would become marked.

In addition, dividing of input signals into several bands by a conventional band dividing method using a IIR or FIR filter and sequent controlling of a gain of a specific frequency band that could be hardly said that it is narrow means that the voice is enhanced under condition that the noise components are not separated from the sound component yet. For this reason, in some contents where any sound except voice and speech, for example, BGM or natural ambient sound is added as the background sound, the clearness of serif and vocal is not always improved and therefore, the voice is reproduced while being buried in the background sound.

In consideration of the above-mentioned problem, an object of the present invention is to provide an audio signal processing device and an audio signal processing method, both of which can reduce noise components included in the audio signals without specifying the noise components in advance and with a simple computation.

In the above audio signal processing device and the above audio signal processing method, additionally, an additional object is to enhance the voice communication while restraining a deterioration of sound quality against the audio signals containing the noise components without causing an increase in circuit size.

In order to attain the above objects, according to a first aspect of the present invention, there is provided an audio signal processing device comprising: a frame division unit dividing inputted audio signals into frames as predetermined units; a frequency converter converting the audio signals on a frame-to-frame basis from time-domain signals to frequency signals as frequency-domain signals; a level detector detecting respective levels of spectrums of respective frequencies from the frequency signals with respect to each frame; a level control value setting unit executing a reduction amount setting process of setting a level control value for reducing the levels of the spectrums having levels within a level range between a first threshold value and a second threshold value set lower than the first threshold value, with respect to each frame; a level control value smoothing unit executing a smoothing process of temporally smoothing a difference between one level control value set in a present frame as an object to be processed for reducing noise presently and another level control value that has been used in another frame preceding to the present frame by one frame temporally; a storage unit storing the level control value after the smoothing process; a spectral adjustment unit multiplying the level control value after the smoothing process, of the frame as the object to be processed for reducing noise, by the frequency signals of the frame thereby executing a level adjustment; and a reverse frequency converter converting the frequency signals, whose levels have been controlled by the spectral adjustment unit, into a time-domain audio signals.

According to a second aspect of the present invention, there is also provided an audio signal processing method comprising the steps of: dividing inputted audio signals into frames as predetermined units by a frame division unit; converting the audio signals on a frame-to-frame basis from time-domain signals to frequency signals as frequency-domain signals by a frequency converter; detecting respective levels of spectrums of respective frequencies from the frequency signals with respect to each frame by a level detector; executing a reduction amount setting process of setting a level control value for reducing the levels of the spectrums having levels within a level range between a first threshold value and a second threshold value set lower than the first threshold value, with respect to each frame by a level control value setting unit; executing a smoothing process of temporally smoothing a difference between one level control value set in a present frame as an object to be processed for reducing noise presently and another level control value that has been used in another frame preceding to the present frame by one frame temporally by a level control value smoothing unit; storing the level control value after the smoothing process in a storage unit; multiplying the level control value after the smoothing process, of the frame as the object to be processed for reducing noise, by the frequency signals of the frame thereby executing a level control by a spectral adjustment unit; and converting the frequency signals, whose levels have been controlled by the spectral adjustment unit, into time-domain audio signals by a reverse frequency converter.

BRIEF DESCRIPTION OF DRAWINGS

FIG. 8 are conceptual diagrams showing levels at the time of inputting/outputting with respect to each frequency spectrum in case of carrying out the noise reduction process and the audio enhancing process, in which FIG. 8(a) is a view showing the level at the time of inputting and FIG. 8(b) is a view showing the level after executing the noise reduction process and the audio enhancing process.

BEST MODE FOR CARRYING OUT THE INVENTION

An audio signal processing device related to one embodiment of the present invention will be described below, with reference to FIGS. 1 to 8.

Figure 1:
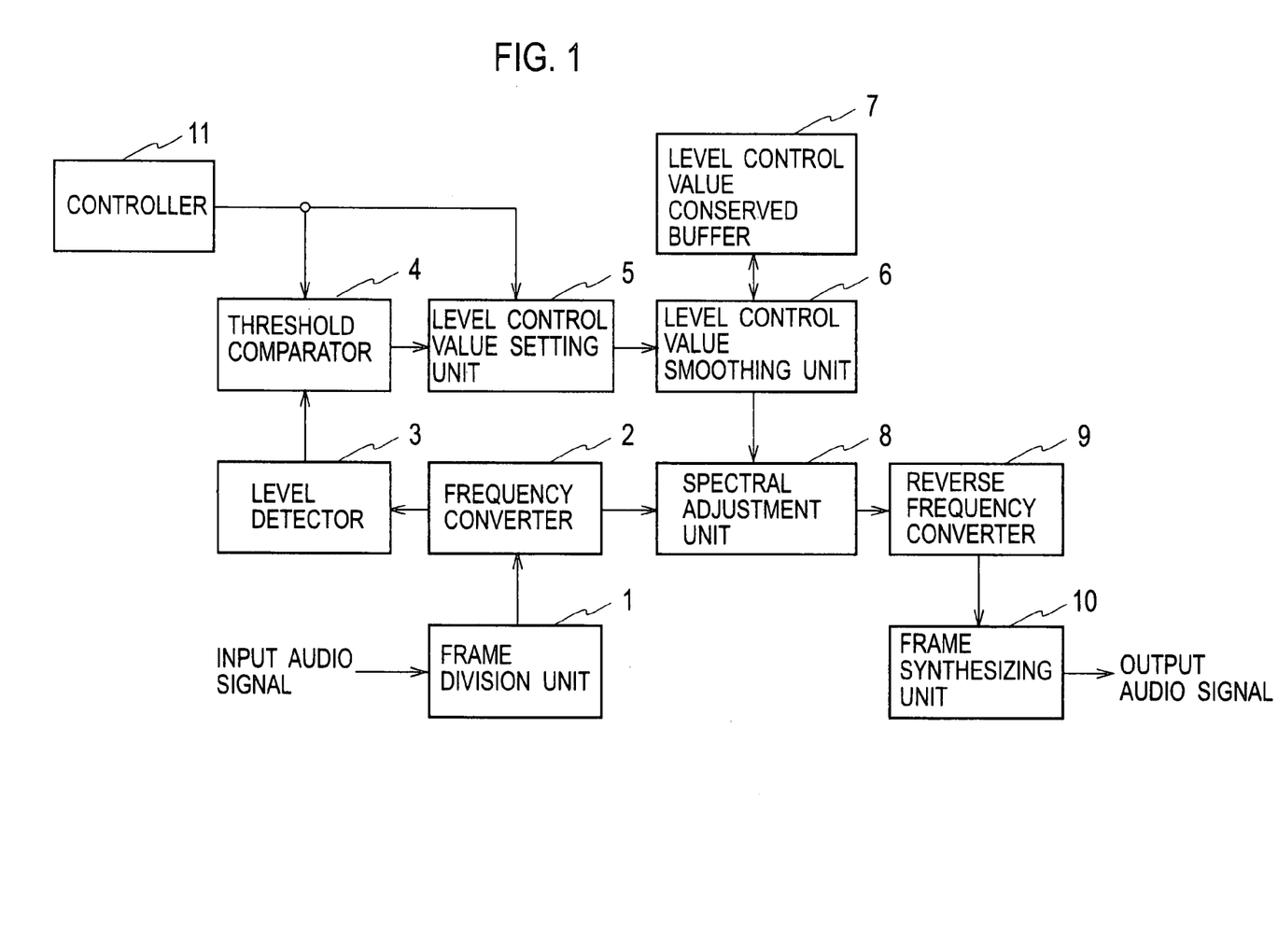
FIG. 1 is a block diagram showing the constitution of an audio signal processing device in accordance with an embodiment of the present invention.

FIG. 1 is a block diagram showing the constitution of an audio signal processing device related to the embodiment of the present invention. As shown in FIG. 1, the audio signal processing device of the embodiment includes a frame division unit 1, a frequency converter 2, a level detector 3, a threshold comparator 4, a level control value setting unit 5, a level control value smoothing unit 6, a level control value conserved buffer 7, a spectral adjustment unit 8, a reverse frequency converter 9, a frame synthesizing unit 10 and a controller 11.

The frame division unit 1 divides audio signals in units of frames obtained by compartmentalizing digital signals inputted from an outside every a predetermined number of samples.

The frequency converter 2 converts the audio signals inputted through the frame division unit 1 from time-domain signals into frequency-domain signals and further provides so-obtained frequency signals to the level detector 3 and the spectral adjustment unit 8.

If applying a reverse frequency conversion on the frequency signals converted by the frequency converter 2 while keeping their overlap structures, original audio signals could be reproduced so long as the computing accuracy of the conversion is maintained. As an example of typical frequency converting method used by the frequency converter 2, there is a method of performing frequency conversion and reverse conversion while overlapping halves of block sizes, such as FFT (Fast Fourier Transform) and MDCT (Modified Discrete Cosine Transform).

Note that a multistage-structural filter bank like a polyphase filter may be used in the frequency converting method. However, as the filter bank causes slight signal component to leak into adjacent bands, when adjusting the level of signals after later-mentioned band division, there is a need of paying attention because the filter bank might exert an influence on the vicinities of an appropriate frequency.

The level detector 3 detects the levels of spectrums of respective frequencies by the frequency signals inputted through the frequency converter 2 and outputs a detection result to the threshold comparator 4.

The threshold comparator 4 compares the revels of respective spectrums detected by the level detector 3 with threshold values T1, T2 established as upper and lower limits of a typical noise-components level. Again, the threshold comparator 4 compares the revels of respective spectrums detected by the level detector 3 with T3, T4 established as upper and lower limits of a level producing an audio enhancing effect.

The threshold values T1 to T4 are given by the controller 11. The threshold values T1 to T4 are established so as to meet the relationship: a minimum signal level$\leq$T2$\leq$T1$\leq$T4$\leq$T3$\leq$a maximum signal level. The minimum signal level and the maximum signal level are respective levels which have been previously established as lower and upper limits of the input audio signals, respectively.

The threshold comparator 4 inputs control signals indicating to either validate or invalidate the noise reduction process and the audio enhancing process, from the controller 11. For instance, if it is indicated to invalidate the noise reduction process, then the threshold comparator 4 does not compare the levels of respective spectrums with the threshold values T1, T2. If it is indicated to invalidate the audio enhancing process, then the threshold comparator 4 does not compare the levels of respective spectrums with the threshold values T3, T4.

Based on the comparison result at the threshold comparator 4, the level control value setting unit 5 assumes that the noise components are included in a spectrum having a level within a range from the threshold value T1 to the threshold value T2, and also executes a reduction amount setting process to set a level control value for reducing the above level with respect to each frame. Based on the comparison result at the threshold comparator 4, the level control value setting unit 5 also assumes that the audio component is included in a spectrum in a predetermined frequency band including a voice band, which has a level within a range from the threshold value T3 to the threshold value T4, and also executes an amplification amount setting process to set a level control value for increasing the above level with respect to each frame.

Similarly to the threshold comparator 4, the level control value setting unit 5 inputs control signals indicating to either validate or invalidate the noise reduction process and the audio enhancing process, from the controller 11. For instance, if it is indicated to invalidate the noise reduction process, then the level control value setting unit 5 does not execute the reduction amount setting process. If it is indicated to invalidate the audio enhancing process, then the level control value setting unit 5 does not execute the amplification amount setting process.

The level control value smoothing unit 6 reads out a level control value, which has been used in a frame preceding the present frame by one frame temporally, from the level control value conserved buffer 7 and further executes a smoothing operation to temporally smooth a difference between a level control value for the present frame set by the level control value setting unit 5 and the above level control value used in the frame preceding the present frame. Then, the level control value smoothing unit 6 outputs the level control value for the present frame after the smoothing operation and further stores the smoothed level control value in the level control value conserved buffer 7.

The level control value conserved buffer 7 stores respective level control values used for frames in the past.

The spectral adjustment unit 8 performs the level adjustment by multiplying frequency signals for the present frame inputted from the frequency converter 2 by the smoothed level control value for the present frame inputted from the level control value smoothing unit 6.

The reverse frequency converter 9 converts the frequency signals, whose levels have been controlled by the spectral adjustment unit 8, into time-domain signals and further outputs them.

The frame synthesizing unit 10 restores the signals from the reverse frequency converter 9 to audio signals continuous on a temporal axis by adding a length of an overlapped frame to the signal from the reverse frequency converter 9 half and half The controller 11 outputs a control signal indicating to either validate or invalidate the noise reduction process and the audio enhancing process respectively, to the threshold comparator 4 and the level control value setting unit 5. The control signal to the threshold comparator 4 contains the threshold values T1 to T4. The threshold values T1 to T4 may be formed by preset values. Alternatively, the controller 11 may retain multiple combinations each consisting of the threshold values T1 to T4 and output one selected from the combinations to the threshold comparator 4.

Next, the operation of the audio signal processing device of the embodiment will be described.

When the audio signals in the form of digital signals are inputted from the outside, the frame division unit 1 divides the audio signals into frames by compartmentalizing the audio signals every a predetermined number of samples in accordance with the frequency analyzing method used in the frequency converter 2 on the subsequent stage. If the frequency converter 2 employs such a frequency analyzing method as FFT or MDCT, the number of samples per frame would be equal to a numerical value expressed by a power-of-two.

Note that the input audio signals are supposed to be digital signals. However, if analogue signals constitute the audio signals, they would be first converted to digital signals by a not-shown A/D converter and subsequently inputted to the frame division unit 1

Next, the frequency converter 2 converts the audio signals having a frame construction, which have been divided every a predetermined number of samples by the frame division unit 1, from time-domain signals to frequency-domain signals and further outputs the converted frequency signals to the level detector 3 and the spectral adjustment unit 8.

Next, from the frequency signals inputted from the frequency converter 2, the level detector 3 detects the levels of spectrums of respective frequencies and further outputs the detection result to the threshold comparator 4.

It is noted that if a filter bank is adopted as the frequency conversion method, band division signals correspond to spectrums. If a polyphase filter is adopted as the frequency conversion method, the spectrum will be defined as one designating the band division signal, hereinafter.

The audio signal processing device of the embodiment can execute either the noise reduction process or the audio enhancing process only, or both of them simultaneously. First, the operations of the threshold comparator 4, the level control value setting unit 5 and the level control value smoothing unit 6 in the noise reduction process will be described below.

In the noise reduction process, the threshold comparator 4 compares the levels of respective spectrums detected by the level detector 3 with the threshold values T1, T2 previously established as upper and lower limits of a typical noise-components level respectively.

We now explain the threshold values T1, T2. In a broadcasting receiver, such as television, hum noise may get mixed in analogue broadcasting depending on its receiving sensitivity and may be added to audio signals. Further, not limited to analogue broadcasting, various background noises get in broadcasting contents, and there exist a wide variety of noise components by broadcasters, programs and scenes.

In addition, when connecting a recording/reproducing equipment, such as VTR, the audio signals are subjected to power-supply noise accompanied with a mechanical drive and generated in reading data out of a recording media in an analogue equipment, and further influenced by image signals passing through the equipment. Even a digital equipment is no exception where similar noises to the above analogue equipment would be added to audio signals unless the equipment is completely formed by digital circuits only. Further, quantization noise generated in compressing the audio signals is also contributory to such deterioration of the audio signals.

In a hard disc recorder whose recordable media is a hard disc, periodical noises are generated due to fluctuations in the power supply derived from the rotation control for HDD (Hard Disc Drive) or DVD (Digital Versatile Disc) drive. Such periodical noises may be acoustically unfavorable in comparison with conventional white noise or hiss noise at VTR. Further, when using a signal processing chip of low accuracy, raspy quantization noise inherent in a compressive audio equipment is produced due to chip's insufficient computing accuracy and further added to audio signals.

In the noise components composed of above-mentioned combined factors, it is difficult to identify the kind of noise and therefore, the conventional technique of reducing noise on the ground of a model noise is not proper. Thus, according to the embodiment, upon the establishment of threshold values T1, T2 as upper and lower limits of a typical noise-components level, the levels of signals within a range between the threshold value T1 and the threshold value T2 are reduced by a certain constant level to obscure the noise components acoustically.

Figure 2:
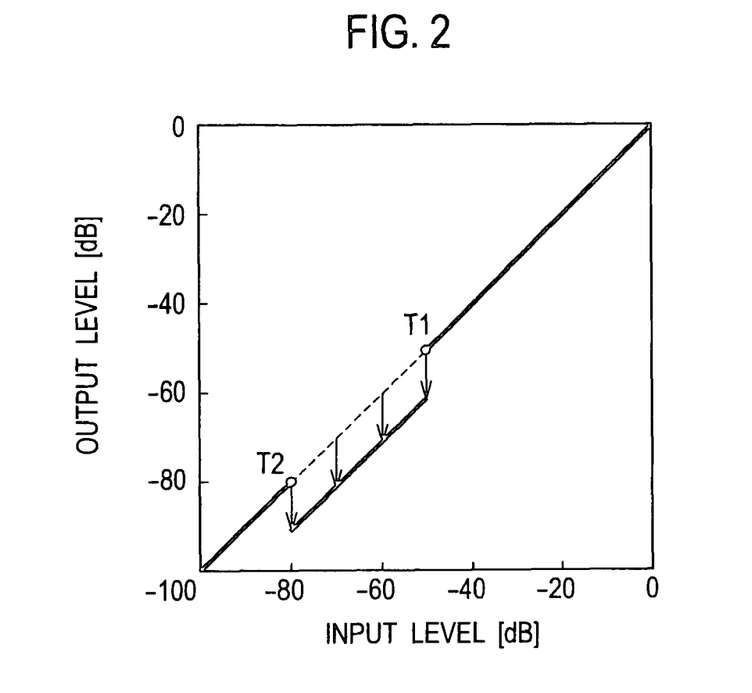
FIG. 2 is a view showing a level control zone for a noise reduction process.

FIG. 2 is a diagram showing a level control zone for the noise reduction process. In FIG. 2, the threshold values T1, T2 correspond to −50 dB, −80 dB, respectively. The range between the threshold value T1 and the threshold value T2 (−50 dB~−80 dB) is nearly equal to the typical noise-component level added to contents.

Next, based on the comparison result obtained by the threshold comparator 4, the level control value setting unit 5 assumes that noise components are included in a spectrum having a level within the range between the threshold value T1 and the threshold value T2 and further executes a reduction amount setting process for reducing the level of the spectrum.

For instance, in case of reducing the level by 6 dB, the level control value is set to 0.5. If it is required to attain a uniform reduction effect on the noise level over the overall band, it has only to reduce amplitude values of the spectrums in this way, in other words, multiply the levels by a numerical value less than 1. Setting up a standard that the noise level cab be reduced by approx. 6 dB since a value after multiplication decreases by half in comparison with the value before multiplication, the level control value is established. If desired to reduce the memory usage of the level control value conserved buffer 7, the level control value may be identical to a constant value throughout the whole band. Otherwise, the level control value may be established with respect to each spectrum or each frequency band. In addition, the level control value may be established in fines with respect to each level of the spectrum.

If the spectrum level is more than the threshold value T1, it can be expected that the noise components are unnoticeable due to masking effect of signal components. Therefore, in case of executing the noise reduction process only, the level adjustment is not basically carried out with respect to spectrums having levels more than the threshold value T1, presuming that such spectrums have the superiority of audio components. However, as the noise reduction process causes the power of the overall audio signals to be somewhat reduced, the level control value more than 1 may be set for the spectrums having levels more than the threshold value T1 in order to maintain the input power and the output power equally.

Further, when the level of a spectrum is less than the threshold value T2, the level adjustment is not executed basically since the noise level can be suspected to be remarkably low. However, as similar to the spectrum having a level more than the threshold value T1, the level control value more than 1 may be established for the spectrum having a level less than the threshold value T2.

Note that the threshold values T1, T2 may be set to common values throughout the whole bands. Alternatively, the threshold values T1, T2 may be set with respect to each spectrum or frequency band individually. In case of common threshold values T1, T2 throughout the frequency bands, it is possible to simplify the process and reduce the size of a memory (not shown) storing threshold values T1, T2. While, in case of setting them with respect to each spectrum or frequency band individually, it is possible to exert the noise reduction effect that is more superior acoustically.

Figure 3:
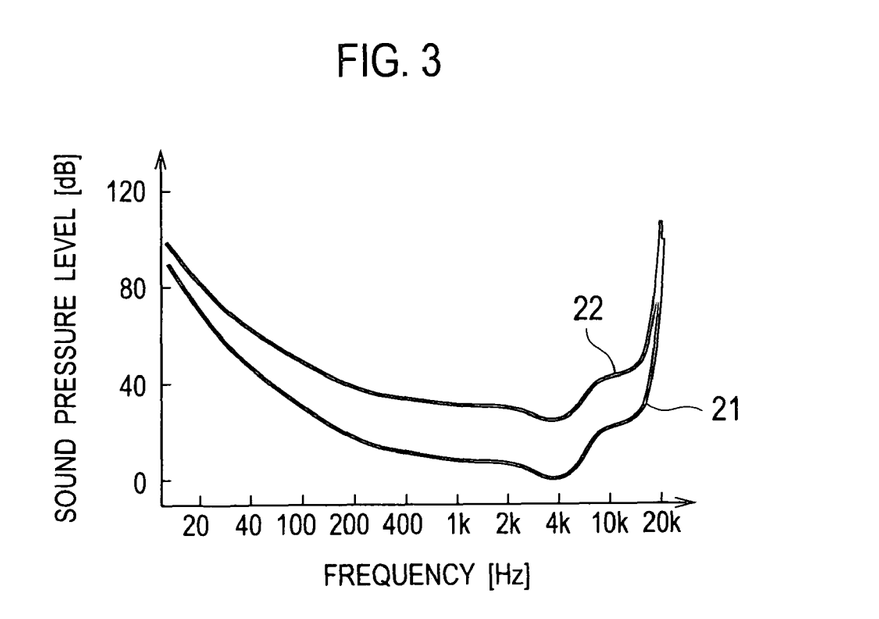
FIG. 3 is a view showing the frequency characteristic of human auditory sensation.

Human's auditory characteristic varies according to the frequency. That is, it is known that if sounds differ from each other in terms of their frequencies in spite of constant sound pressure, the sounds fall on human's ears as if their sound volumes were different from each other. Assuming that a vertical axis represents sound pressures while a horizontal axis represents frequencies, the sound pressure levels of respective frequencies falling on human's ears at the same sound volume are represented by curves shown in FIG. 3. In FIG. 3, a lower curve designates a minimum audible characteristic curve 21. That is, a human cannot perceive a sound having a sound pressure level less than the sound pressure level represented by the minimum auditory characteristic curve 21.

It is therefore hoped that a certain sound could change to a listener-friendly sound in audibility by establishing a high threshold value T2 for the frequency band providing the listener with low sensitivity (e.g. low range less than 1 kHz and high range more than 8 kHz) and a low threshold value T2 for the frequency band providing the listener with high sensitivity (e.g. middle range from 1 kHz to 8 kHz).

Meanwhile, in the frequency conversion method where its overlap structure restrains a strain at the block boundary, appropriate inverse transformation is not performed by a spectrum level different from a primary level, so that its difference component changes to quantization noise, generating by-productive noise.

In order to avoid this phenomenon, according to the embodiment, the level control value smoothing unit 6 applies smoothing on the level control value in a temporal direction to reduce the degree of incidence related to the temporal change of spectrum and moderate the change of a level control value applied to the adjoining conversion block, preventing an occurrence of quantization noise.

The level control value smoothing unit 6 reads out the level control value, which has been used in a frame temporally preceding the present frame by one frame, from the level control value conserved buffer 7 and performs the smoothing process to temporally smooth the readout level control value against the level control value of the present frame. This process has the function of restraining the quantization noise generated from a difference quantity between an inter-block spectral data and the original signal, which is produced due to the above-mentioned rapid level change.

For instance, if representing the level control value of the preceding frame by $A_{before}$ and the level control value of the present frame newly established by the level control value setting unit 5 by $A_{now}$, then a finally-applied level control value A can be calculated as follows:

$$A=(A_{before}\times(N-1)+A_{now})/N. \quad (1)$$

Here N is a time constant. Supposing "S" designates a signal level, an error amount ΔS generated by the level adjustment is represented as follows:

$$\Delta S=S-S\times A=S(1-A). \quad (2)$$

A situation causing the error amount ΔS to be maximized is as follows: one case when one level more than the threshold value T1 changes to another level less than and close to the threshold value T1 after the former level persists for long periods; or the opposite case when, after a level less than T1 and more than T2 persists for long periods, one level less than and close to T1 changes to another level more than T1.

By substituting T1 for S and also allowing $A_{before}$ to approach 1, the error amount (maximum error amount)$\Delta S_{max}$ can be defined by the expressions (1) and (2) as follows:

$$\Delta S_{max}=T1\times(1-\alpha)/N. \quad (3)$$

Here α corresponds to $A_{now}$. Upon the establishment of α and T1, a minimum audible level P as the allowable noise level is obtained by the minimum audible characteristic curve 21 in FIG. 3. Then, by regarding P as $\Delta S_{max}$, the time constant N of smoothing is calculated by the expression (3) as follows:

$$N=T1\times(1-\alpha)/P. \quad (4)$$

Note that the time constant N has to be considered in view of both of the noise reduction effect and the time responsibility, and therefore, it is not always have to meet the above expression (4). For instance, if placing a significance on the rising of sounds, the time constant may be reduced furthermore.

The level control value smoothing unit 6 outputs the level control value for the present frame after the smoothing process obtained by the above-mentioned operation to the spectral adjustment unit 8 and also stores the level control value in the level control value conserved buffer 7.

Next, in the audio enhancing process, the operations of the threshold comparator 4, the level control value setting unit 5 and the level control value smoothing unit 6 will be described.

In the audio enhancing process, the threshold comparator 4 compares the levels of respective spectrums detected by the level detector 3 with the threshold values T3, T4. For instance, the threshold values T3, T4 may be set to −6 dB, −40 dB, respectively.

Next, based on the comparison result at the threshold comparator 4, the level control value setting unit 5 assumes that the audio component is included in spectrums in a predetermined frequency band including a voice band, which have levels within a range between the threshold value T3 and the threshold value T4, and also executes an amplification amount setting process to set a level control value for increasing the above levels.

In order to increase the level, the level control value is set to a value more than 1. The level control value may be identical to a constant value throughout the whole band. Otherwise, the level control value may be established with respect to each spectrum or each frequency band. In addition, the level control value may be established in fines with respect to each level of the spectrum.

In addition, the level control value may be established so that the frequency characteristic of the amplification amount based on the level control value changes corresponding to the genre of contents including the input audio signals.

Figure 4:
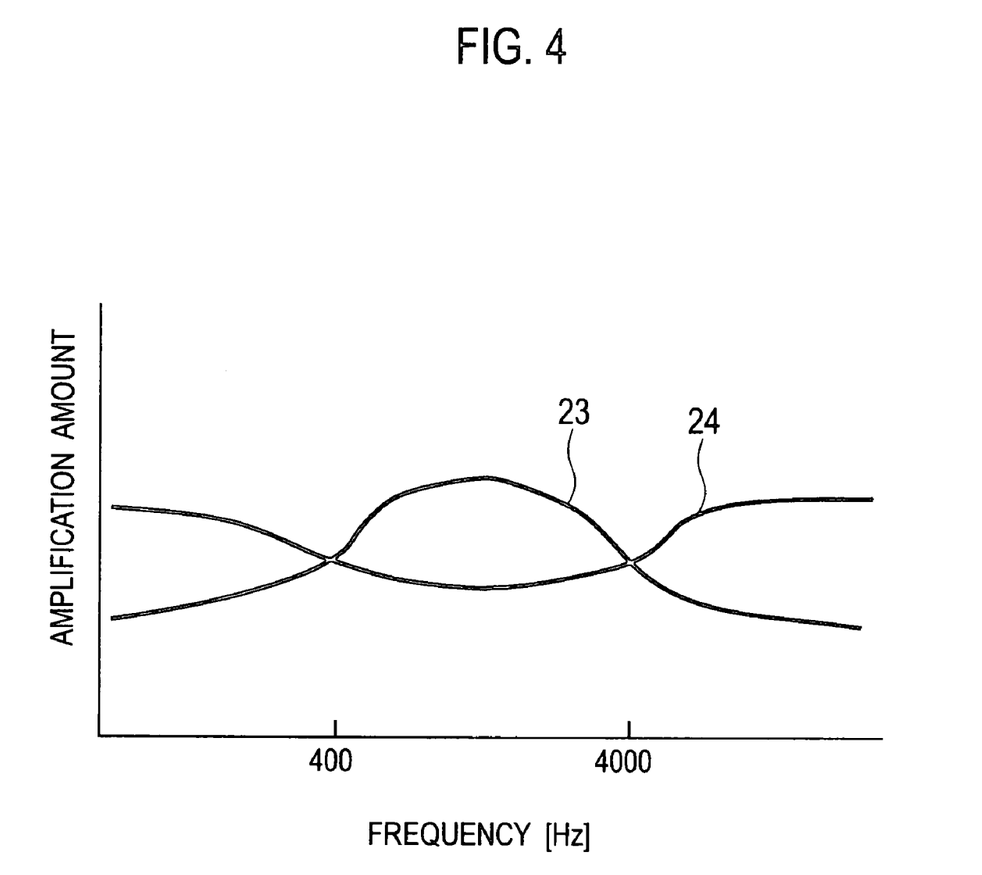
FIG. 4 is a view showing one example of the frequency characteristic of amplification amount in an audio enhancing process.

In case of the contents in the category like news and drama, as shown with a curve 23 in FIG. 4, the level control value is established so as to emphasize human's voice furthermore by increasing the amplification amount of a human voice band (e.g. 400 Hz~4000 Hz) in comparison with the other bands.

Regarding the contents in the category of music, meanwhile, as shown with a curve 24 in FIG. 4, the level control value is established so as to weakly amplify a human voice band in comparison with the other bands, in view of preventing its balance as music from collapsing. The category for contents can be taken out from a program information etc. included in airwaves.

Note that along with the threshold values T1, T2, the threshold values T3, T4 may be also set to common values throughout the whole bands. Alternatively, the threshold values T3, T4 may be set with respect to each spectrum or frequency band individually.

Next, the level control value smoothing unit 6 executes the smoothing process in the temporal direction against the level control value established by the level control value setting unit 5. Although the contents of the smoothing process are similar to those of the noise reduction process mentioned above, the time constant at the smoothing process is obtained by replacing T1 of the expression (4) by T3, for example.

Alternatively, there may be adopted a time constant N1 calculated by $$N1 = T3 \times (1-\alpha)/P1. \qquad (5)$$

Here P1 designates an allowable noise level value obtained by a curve 22 of FIG. 3. The curve 23 illustrates the sound pressure level of respective frequencies that can be caught by human's ears at a predetermined sound volume larger than the sound volume corresponding to the minimum audible characteristic curve 21. FIG. 3 represents that if the sound volume audible to human's ears gets increased, the sound pressure level imperceptible to the human's audibility also gets increased.

Therefore, in the audio enhancing process enhancing the sound component, the allowable noise level is increased in comparison with that in the noise reduction process. Thus, the smoothing process may be executed with the use of the time constant N1 calculated by using the allowable noise level value P1 larger than the minimum audible level P.

The level control value smoothing unit 6 outputs the level control value for the present frame after the smoothing process to the spectral adjustment unit 8 and also stores the level control value in the level control value conserved buffer 7.

As the above operation in the noise reduction process and the above operation in the audio enhancing process are independent of each other, only either the former operation or the latter operation may be executed or both of them may be executed simultaneously, in response to the control signals of the controller 11.

On the completion of the smoothing process, the spectral adjustment unit 8 performs a level adjustment by multiplying the smoothed level control value of the present frame inputted from the level control value smoothing unit 6 by the frequency signals (spectrums) of the present frame inputted from the level control value smoothing unit 2.

Next, the inverse frequency conversion unit 9 converts the frequency signals, whose levels are controlled by the spectral adjustment unit 8, to time-domain signals and further outputs them.

Then, the frame synthesizing unit 10 restores the time-domain signals from the reverse frequency converter 9 to successive audio signals on the temporal axis by adding the time-domain signals half and half of the overlapped frame lengths. If desired, the audio signals on the temporal axis restored by the frame synthesizing unit 10 are converted to analogue signals by a not-shown D/A converter and subsequently outputted to the outside.

Figure 5:
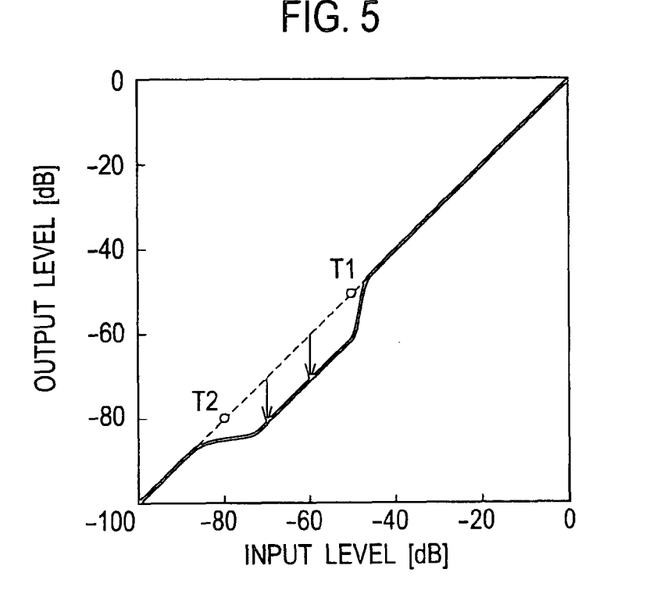
FIG. 5 is a view showing the relationship between an input signal level and a smoothed output signal level after controlling the level in the noise reduction process.
Figure 6:
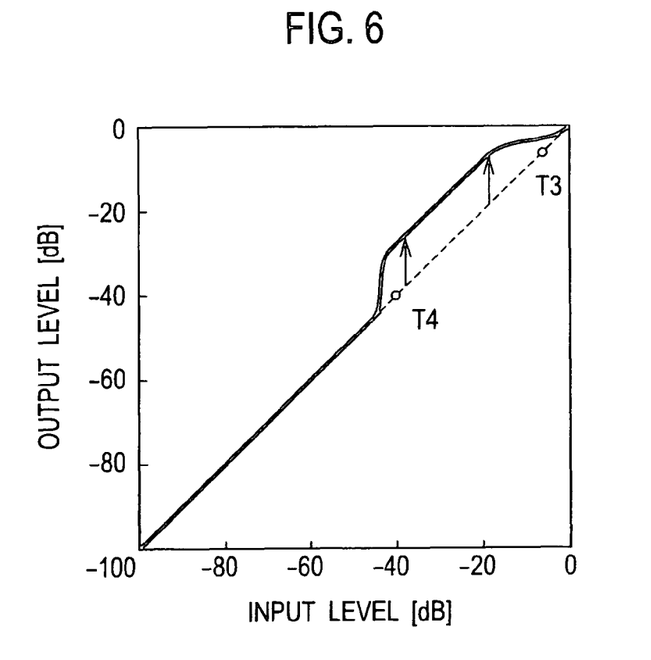
FIG. 6 is a view showing the relationship between the input signal level and the smoothed output signal level after controlling the level in the audio enhancing process.
Figure 7:
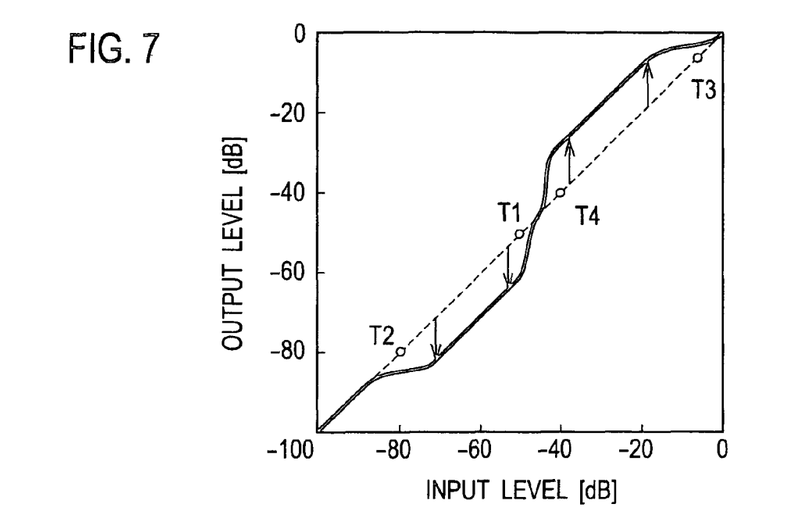
FIG. 7 is a view showing the relationship between the input signal level and the smoothed output signal level after controlling the level in case of carrying out the noise reduction process and the audio enhancing process.

FIG. 5 is a view showing the relationship between an input signal level and a smoothed output signal level after controlling the level in the noise reduction process. FIG. 6 is a view showing the relationship between the input signal level and the smoothed output signal after controlling the level in the audio enhancing process. FIG. 7 is a view showing the relationship between the input signal level and the smoothed output signal level after controlling the level in case of carrying out the noise reduction process and the audio enhancing process.

Although it is possible to reduce the quantization noise components owing to the smoothing process, the conventional method does not supply a time constant based on human's auditory characteristics, so that component may be perceived according to the circumstances. In the conventional method, additionally, there is the possibility of setting a long time constant unnecessarily. In such a case, the rising of sound becomes dull to damage the musical property.

As shown in FIGS. 5 to 7, according to the embodiment, it is possible to reduce by-productive quantization noise generated at the level adjustment, owing to the smoothing process. In addition, as the time constant for smoothing is provided based on human auditory sensation as shown in FIG. 3, it is possible to reduce the possibility of the quantization noise being perceived.

Again, even when uniformly controlling the level as shown in FIG. 2, it is possible to avoid discontinuous changes in level at the threshold values T1, T2 by executing the smoothing process, as shown in FIG. 5. Accordingly, there is no need of high-load dB calculations against individual spectrums, allowing the quantity of computations to be reduced remarkably.

In addition, if it is avoided that the level of faint signals (imperceptible noise components) less than the threshold value T2 is decreased, audio signals having favorable S/N ratios (i.e. case of noise level less than T2) can approach original signals as possible since the level adjustment does not work, so that the influence on sound quality can be reduced remarkably. Conversely, if no threshold value 12 as a lower limit is established, in case of the audio signals rising rapidly after faint signals have been generated in succession, the feeling of attack inherent to the audio signals would be weakened by an amount of noise reduction designated by the level control value.

In the conventional noise reduction method directed to mobile telephones or TV telephones dealing with audio signals principally involving voice or speech, it is assumed that there exists background noise. In case of a TV receiver dealing with broad-band audio signals having various S/N ratios, it was considerably difficult to maintain the property of music due to continuous action of the noise reduction effect. According to the embodiment, while preparing for the audio signals having favorable S/N ratios with the establishment of the threshold value T2 thereby to maintain the property of music, the noise reduction control in accordance with different perceptual sensitivities depending on the frequency bands can be accomplished by reflecting the minimum audible characteristic with respect to each frequency.

Note that the level adjustment of spectrum may be carried out with respect to each spectrum independently. Alternatively, the level adjustment of spectrum may be carried out for each frequency band grouping a plurality of spectrums and having a certain frequency band range. In particular, in case of an audio source of a single musical instrument including overtone components, such as a stringed instrument, if the level adjustment is applied to a specific frequency band collectively, the peak of signals would get dull. Accordingly, it is desirable to perform the level adjustment with respect to each spectrum.

While, if required to reduce the capacity of the reverse frequency converter 9, the capacity of a memory necessary for storing individual threshold values or the load for calculating the level control values, it is preferable to group the spectrums. As for the grouping, there is adopted either to organize spectrums by equally-spaced frequency bands or to organize them by critical band ranges defined by human auditory sensation which is narrower as the sound is lower and broader as the sound is upper.

In this way, according to the embodiment, as the level adjustment is carried out while temporally smoothing the frequency signals in a level band where the general noise components on consideration of human auditory sensation remain in existence, it is possible to reduce the noise components with simple calculations and without specifying the noise components for different background noise or power-supply noise accompanied with mechanical drives. As a result, it is possible to supply a user with easy-to-hear voice sound.

Figure 8:
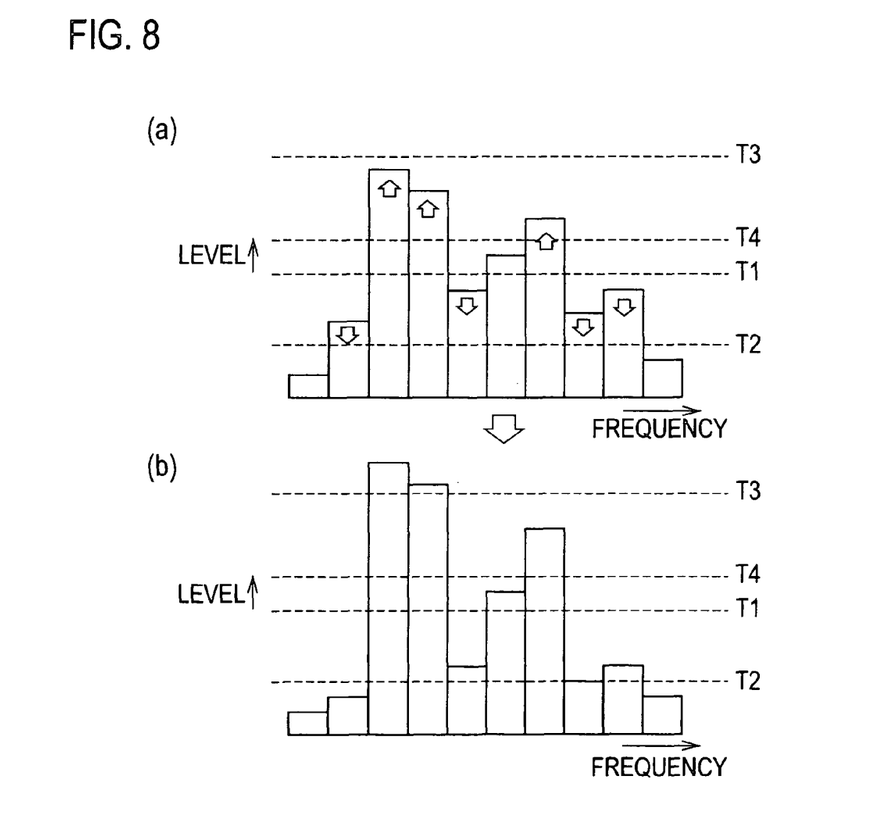

FIG. 8 are conceptual diagrams showing levels at the time of inputting/outputting with respect to each frequency spectrum in case of carrying out the noise reduction process and the audio enhancing process. FIG. 8(a) is a view showing the level at the time of inputting, while FIG. 8(b) is a view showing the level after executing the noise reduction process and the audio enhancing process. It's not that the level control value is instantly established in a particular time (frame) by the weighting of the past conditions at the level control value smoothing unit 6. However, as shown in FIGS. 8(a) and 8(b), the spectrums in the range from T4 to T3 are amplified, while the spectrums in the range from T2 to T1 are attenuated, enabling the audio enhancing effect and the noise reduction effect to be produced in a single process.

Note, the level control value has to be established so that an attenuation amount GainN for noise reduction meets the relationship of Gain N≦(input signal level−minimum signal level), and an attenuation amount Gain S for audio enhancement meets the relationship of Gain S≦(maximum signal level−input signal level). If these conditions are not satisfied, there is the possibility of causing the sound quality to be deteriorated by an occurrence of noise etc.

In this way, according to the embodiment, by converting the audio signals from time-domain signals to frequency-domain signals and further applying a noise reduction process and an audio enhancing process to the converted frequency signals, it is possible to emphasize voice for the audio signals including the noise components while restraining a deterioration of sound quality. Compared with a technique of performing the noise reduction process and the audio enhancing process in the time domain, additionally, it is possible to perform finely-tuned processes and also possible to provide voice sound which is more natural acoustically and easy to be heard.

In addition, as the common constitution realizes both the noise reduction process and the audio enhancing process, it is possible to reduce an increase in circuit size.

In connection, the functions of the audio signal processing device of the embodiment may be embodied by a computer executing a program. This program may be downloaded from a recording medium into the computer. Alternatively, the program is transmitted to the computer through a communication network.

INDUSTRIAL APPLICABILITY

According to the audio signal processing device of the present invention, it is possible to reduce the noise components included in the audio signals without specifying the noise components in advance and with simple computations.

In addition, according to the audio signal processing device of the present invention, for audio signals containing the noise components, it is possible to emphasize audio sound while reducing deterioration of the sound quality without causing an increase of the circuit size.

The invention claimed is:

1. An audio signal processing device comprising:
a frame division unit dividing inputted audio signals into frames as predetermined units;
a frequency converter converting the audio signals on a frame-to-frame basis from time-domain signals to frequency signals as frequency-domain signals;
a level detector detecting respective levels of spectrums of respective frequencies from the frequency signals with respect to each frame;
a level control value setting unit executing a reduction amount setting process of setting a level control value for reducing the levels of the spectrums having levels within a level range between a first threshold value and a second threshold value set lower than the first threshold value, with respect to each frame; and
the level control value setting unit executing an amplification amount setting process of setting a level control value for increasing the level of a spectrum in a predetermined frequency band having a level within a range between a third threshold value set more than the first threshold value and a fourth threshold value set more than the first threshold value and less than the third threshold value, with respect to each frame;
a level control value smoothing unit executing a smoothing process of temporally smoothing a difference between one level control value set in a present frame as an object to be processed for reducing noise presently and another level control value that has been used in another frame preceding to the present frame by one frame temporally;
a storage unit storing the level control value after the smoothing process;
a spectral adjustment unit multiplying the level control value after the smoothing process, of the frame as the object to be processed for reducing noise, by the frequency signals of the frame thereby executing a level adjustment; and
a reverse frequency converter converting the frequency signals, whose levels have been controlled by the spectral adjustment unit, into a time-domain audio signals.

2. The audio signal processing device of claim 1, further comprising a controller that controls the level control value setting unit so as to execute either the reduction amount setting process or the selectively.

3. The audio signal processing device of claim 1, wherein the first to fourth threshold values are values established with respect to each spectrum in the frame or each frequency band therein.

4. The audio signal processing device of claim 1, wherein the level control value setting unit sets the level control value so that the frequency characteristic of an amplification amount based on the level control value established at the amplification amount setting process changes corresponding to a genre of contents including the audio signals.

5. The audio signal processing device of claim 1, wherein the level control value smoothing unit determines a time constant of smoothing for the level control value established in the amplification amount setting process with use of:

an allowable noise level value based on a frequency characteristic of human auditory sense in response to a predetermined sound volume;

the third threshold value; and the level control value that the level control value setting unit has established in the amplification amount setting process, against a frame to be processed by the noise reduction process.

6. An audio signal processing method comprising the steps of:

dividing inputted audio signals into frames as predetermined units by a frame division unit;

converting the audio signals on a frame-to-frame basis from time-domain signals to frequency signals as frequency-domain signals by a frequency converter;

detecting respective levels of spectrums of respective frequencies from the frequency signals with respect to each frame by a level detector;

executing a reduction amount setting process of setting a level control value for reducing the levels of the spectrums having levels within a level range between a first threshold value and a second threshold value set lower than the first threshold value, with respect to each frame by a level control value setting unit;

executing an amplification amount setting process of setting a level control value for increasing the level of a spectrum in a predetermined frequency band having a level within a range between a third threshold value set more than the first threshold value and a fourth threshold value set more than the first threshold value and less than the third threshold value, with respect to each frame;

executing a smoothing process of temporally smoothing a difference between one level control value set in a present frame as an object to be processed for reducing noise presently and another level control value that has been used in another frame preceding to the present frame by one frame temporally by a level control value smoothing unit;

storing the level control value after the smoothing process in a storage unit;

multiplying the level control value after the smoothing process, of the frame as the object to be processed for reducing noise, by the frequency signals of the frame thereby executing a level control by a spectral adjustment unit; and converting the frequency signals, whose levels have been controlled by the spectral adjustment unit, into time-domain audio signals by a reverse frequency converter.

* * * * *